US012641990B2

(12) United States Patent
Shen et al.

(10) Patent No.: US 12,641,990 B2
(45) Date of Patent: May 26, 2026

(54) OLED DISPLAY MODULE AND DISPLAY APPARATUS

(71) Applicant: HUAWEI TECHNOLOGIES CO., LTD., Guangdong (CN)

(72) Inventors: Yiyang Shen, Shenzhen (CN); Mengting Lee, Shenzhen (CN); Shuhai Liang, Dongguan (CN); Zhijin Hu, Dongguan (CN); Yuan Xiong, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 579 days.

(21) Appl. No.: 18/182,443

(22) Filed: Mar. 13, 2023

(65) Prior Publication Data

US 2023/0225177 A1 Jul. 13, 2023

Related U.S. Application Data

(63) Continuation of application No. PCT/CN2021/118218, filed on Sep. 14, 2021.

(30) Foreign Application Priority Data

Sep. 14, 2020 (CN) .......................... 202010961402.3

(51) Int. Cl.
H10K 59/80 (2023.01)
G02B 5/30 (2006.01)

(52) U.S. Cl.
CPC ....... H10K 59/8792 (2023.02); G02B 5/3016 (2013.01); H10K 59/878 (2023.02); H10K 59/8791 (2023.02); H10K 59/8793 (2023.02)

(58) Field of Classification Search
CPC ............. H10K 59/8792; H10K 59/878; H10K 59/8791; H10K 59/8793; H10K 59/50;
(Continued)

(56) References Cited

U.S. PATENT DOCUMENTS

| 10,283,735 | B2 | 5/2019 | Kim et al. |
|---|---|---|---|
| 2010/0019666 | A1 | 1/2010 | Park et al. |
| 2010/0072880 | A1 | 3/2010 | Adachi et al. |

FOREIGN PATENT DOCUMENTS

| CN | 101783360 A | 7/2010 |
|---|---|---|
| CN | 104022230 A | 9/2014 |

(Continued)

OTHER PUBLICATIONS

Extended European Search Report issued in EP Application No. 21866113.0 dated Jan. 22, 2024.

(Continued)

*Primary Examiner* — Elmito Breval

(57) ABSTRACT

A display module includes a display layer and a circular polarizer that are stacked, and a light enhancement layer and a light absorption layer that are stacked. The light enhancement layer and the light absorption layer are stacked between the display layer and the circular polarizer. The display layer has a pixel area and a non-pixel area. The light absorption layer is configured to transmit a light ray emitted from the pixel area and absorb a light ray emitted from the non-pixel area. The light ray that passes through the light absorption layer includes a light ray in a first polarization state and a light ray in a second polarization state.

20 Claims, 8 Drawing Sheets

(58) Field of Classification Search
CPC ...... H10K 59/35; G02B 5/3016; G02B 5/003;
G02B 1/11; G02B 5/22; G02B 27/286
See application file for complete search history.

(56) References Cited

FOREIGN PATENT DOCUMENTS

| | | | |
|---|---|---|---|
| CN | 106200094 | A | 12/2016 |
| CN | 110028948 | A | 7/2019 |
| CN | 110521282 | A | 11/2019 |
| CN | 110927857 | A | 3/2020 |
| JP | 2003186413 | A | 7/2003 |
| JP | 2009283246 | A | 12/2009 |
| JP | 2010243769 | A | 10/2010 |
| KR | 20190136737 | A | 12/2019 |

OTHER PUBLICATIONS

International Search Report and Written Opinion issued in PCT Application No. PCT/CN2021/118218 dated Dec. 14, 2021.
Japanese Office Action with English translation issued in JP Application No. 2023-516560 dated Apr. 2, 2024.

100    102

101

1021

1022

200
140

150
140

122
121 } 120
111
110

130
122
121 } 120
111
110

160
150
140
130
122 } 120
121
111
110

170
160
150
140
130
122 } 120
121
111
110

170
160
150
140
141
130
122
121 } 120
111
110

100

1021   1022   1021   1022   1021

170
160
150
132
140
131
130
122
121 } 120
111
110

OLED DISPLAY MODULE AND DISPLAY APPARATUS

CROSS-REFERENCE TO RELATED APPLICATIONS

This application is a continuation of International Application No. PCT/CN2021/118218, filed on Sep. 14, 2021, which claims priority to Chinese Patent Application No. 202010961402.3, filed on Sep. 14, 2020. The disclosures of the aforementioned applications are hereby incorporated by reference in their entireties.

TECHNICAL FIELD

This application relates to the field of display technologies, and in particular, to an organic light-emitting diode (OLED) display module and a display apparatus.

BACKGROUND

An OLED device is a device in which an organic semiconductor material and a luminescent material are driven by an electric field to emit light through carrier injection and recombination. The OLED device has a number of advantages, such as high contrast, a fast response speed, lightness, thinness, and foldability. However, due to an internal metal electrode structure of the OLED display, light reflection due to indoor or external strong light causes interference to reading, and the OLED display is undimmed in a dark state. Usually, a circular polarizer that can resist ambient light reflection is added to the outside of the OLED display. The circular polarizer includes a linear polarizer and a phase compensation film. The circular polarizer adjusts reflected light from an OLED cathode to a polarization state that cannot pass through the linear polarizer. However, emergent light from the OLED is non-polarized light, and 50% of vertically polarization states cannot pass through the circular polarizer. This also causes a loss to output light of the OLED display.

SUMMARY

This application provides an OLED display module and a display apparatus, to improve display brightness of a display module and reduce external light reflection.

According to a first aspect, an OLED display module is provided. The display module is a multi-layer stacked structure. The display module specifically includes a display layer and a circular polarizer that are stacked, and a light enhancement layer and a light absorption layer that are stacked. The light enhancement layer and the light absorption layer are stacked between the display layer and the circular polarizer. The display layer has a pixel area and a non-pixel area. The pixel area is configured to display an image, and the non-pixel area is configured to block a metal wire in the display module. An arrangement direction of the pixel area and the non-pixel area is perpendicular to a stacking direction of the display layer and the circular polarizer. The light absorption layer is configured to transmit a light ray emitted from the pixel area of the display layer, and absorb a light ray emitted from the non-pixel area of the display layer. The light ray that passes through the light absorption layer includes a light ray in a first polarization state and a light ray in a second polarization state. The light enhancement layer is configured to transmit the light ray in the first polarization state, and is configured to reflect at least a part of the light ray in the second polarization state to the metal wire in the OLED display module, to form a light ray in the first polarization state through reflection by the metal wire. The circular polarizer is configured to transmit the light ray in the first polarization state that passes through the light enhancement layer. In the foregoing technical solution, a polarization state of a light ray emitted from the display layer is changed through cooperation between the light enhancement layer and the metal wire in the display module, so that more light rays can pass through the circular polarizer, to improve brightness of the display module. In addition, the disposed light absorption layer absorbs reflected light of an external light ray at a circuit layer, to suppress reflection of the external light ray and improve display effect of the display module.

In a specific implementable solution, a light band enhanced by the light enhancement layer includes a blue light band, a green light band, a red light band, or another band of visible light. A light band absorbed by the light absorption layer is the same as the light band enhanced by the light enhancement layer. Light rays of different bands are enhanced, so that enhancement effect of a specific type of a light ray in the display module can be improved in a targeted manner.

In a specific implementable solution, the light enhancement layer is bonded to the light absorption layer. This facilitates a fixed connection between the light enhancement layer and the light absorption layer.

In a specific implementable solution, the light enhancement layer is bonded to the circular polarizer. This facilitates fastening of the light enhancement layer.

In a specific implementable solution, the light absorption layer includes a black area corresponding to the non-pixel area and a light transmission area corresponding to the pixel area. Reflected light of the external light ray is absorbed by using the black area, and affecting display of the display module is avoided by using the light transmission area.

In a specific implementable solution, the light enhancement layer acts on the blue light band. The pixel area includes at least a blue pixel area, a red pixel area, and a green pixel area. The light absorption layer includes a light transmission area corresponding to the blue pixel area, and a yellow area that corresponds to another pixel area and that is configured to absorb a blue light ray. Alternatively, the light absorption layer includes a light transmission area corresponding to the blue pixel area, a black area corresponding to the non-pixel area, and a yellow area corresponding to another pixel area. This increases intensity of blue light of the display module.

In a specific implementable solution, the light enhancement layer is a cholesteric liquid crystal layer or a material layer with a microstructure, and the microstructure is a nanostructure capable of implementing circularly polarized light selection. Light transmission is enhanced by using different structures.

In a specific implementable solution, when the light enhancement layer is the material layer with a microstructure, the microstructure is a parallelogram array or a circular array. A polarization state of a light ray is changed through cooperation between different microstructures and the metal wire.

In a specific implementable solution, the material layer is an organic material layer.

According to a second aspect, an OLED display module is provided. The display module includes a display layer and a circular polarizer that are stacked, and further includes a light enhancement layer disposed between the display layer and the circular polarizer. The display layer has a pixel area and a non-pixel area. An arrangement direction of the pixel area and the non-pixel area is perpendicular to a stacking direction of the display layer and the circular polarizer. A light ray emitted from the display layer includes a light ray in a first polarization state and a light ray in a second polarization state. The light enhancement layer includes a light enhancement area corresponding to the pixel area. The light enhancement area is configured to transmit the light ray in the first polarization state, and is configured to reflect at least a part of the light ray in the second polarization state to a metal wire in the OLED display module, to form a light ray in the first polarization state through reflection by the metal wire. The circular polarizer is configured to transmit the light ray in the first polarization state that passes through the light enhancement layer. In the foregoing technical solution, a polarization state of a light ray emitted from the display layer is changed through cooperation between the light enhancement layer and the metal wire in the display module, so that more light rays can pass through the circular polarizer, to improve brightness of the display module. In addition, the disposed light absorption layer absorbs reflected light of an external light ray at a circuit layer, to suppress reflection of the external light ray and improve display effect of the display module.

In a specific implementable solution, the light enhancement layer is a cholesteric liquid crystal layer or a material layer with a microstructure, and the microstructure is a nanostructure capable of implementing circularly polarized light selection. Light transmission is enhanced by using different structures.

In a specific implementable solution, when the light enhancement layer is the material layer with a microstructure, the microstructure is a parallelogram array or a circular array. A polarization state of a light ray is changed by using different microstructures and the circuit layer.

In a specific implementable solution, the material layer is an organic material layer.

In a specific implementable solution, the light enhancement layer further includes a protective layer, and the protective layer is filled in a gap between the light enhancement area and covers the light enhancement area. This facilitates disposing of a layer structure, and protects a structure in the light enhancement area.

In a specific implementable solution, the light absorption layer is further included. The light absorption layer includes a black area corresponding to the non-pixel area and a light transmission area corresponding to the pixel area. The light enhancement area is located in the light transmission area. Reflection of the external light ray is reduced by using the light absorption layer.

According to a third aspect, a display apparatus is provided. The display apparatus includes a substrate and a display module that is disposed on the substrate. The display module is the OLED display module according to any one of the foregoing implementations. In the foregoing technical solution, a polarization state of a light ray emitted from a display layer is changed through cooperation between a light enhancement layer and a metal wire in the display module, so that more light rays can pass through a circular polarizer, to improve brightness of the display module. In addition, a disposed light absorption layer absorbs reflected light of an external light ray at a circuit layer, to suppress reflection of the external light ray and improve display effect of the display module.

4

Figures 2, 3:
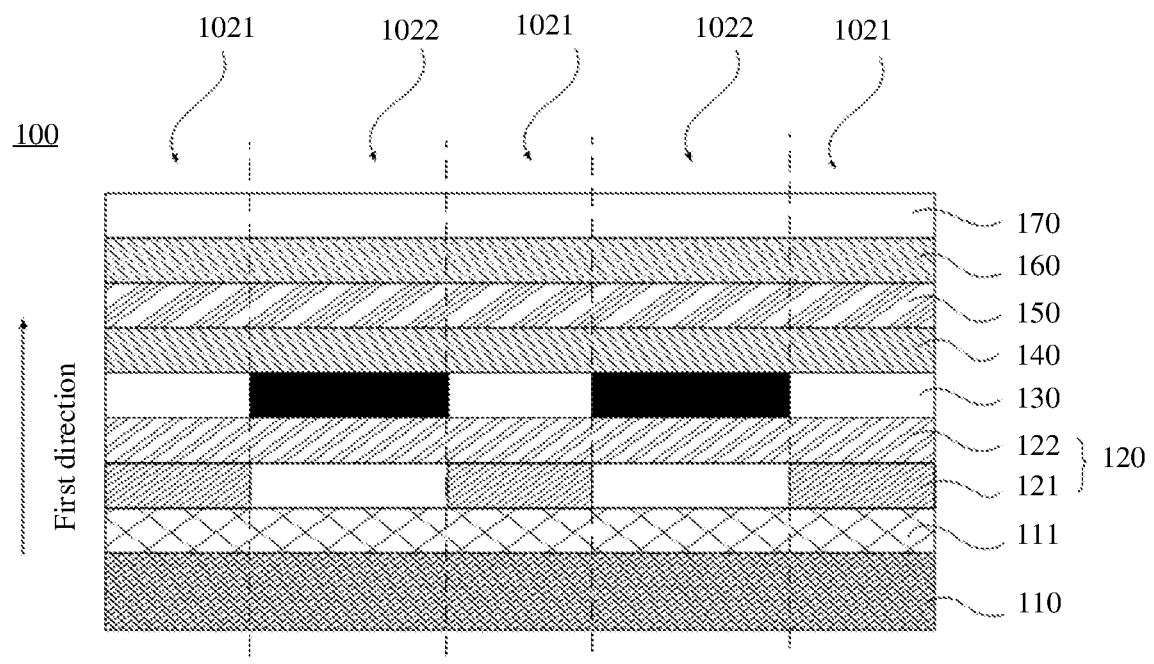
Figures 10, 11:
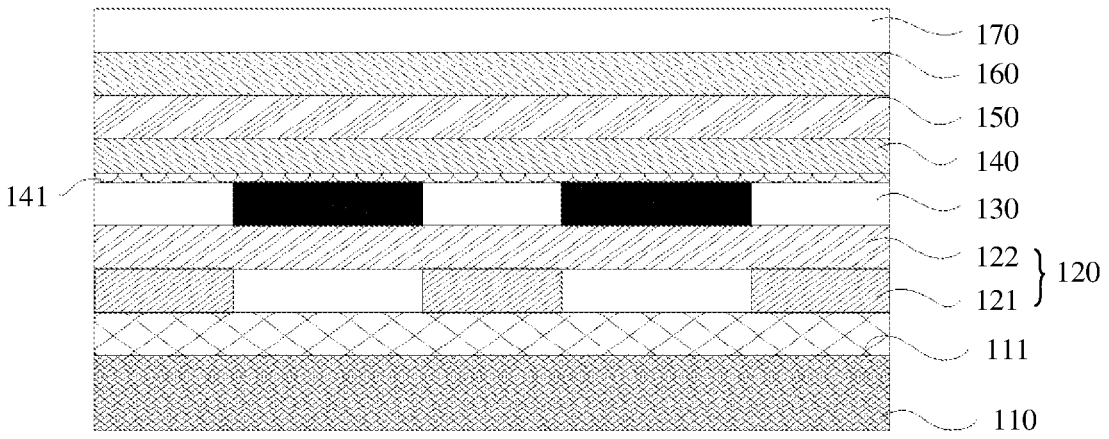
Figures 12, 13:
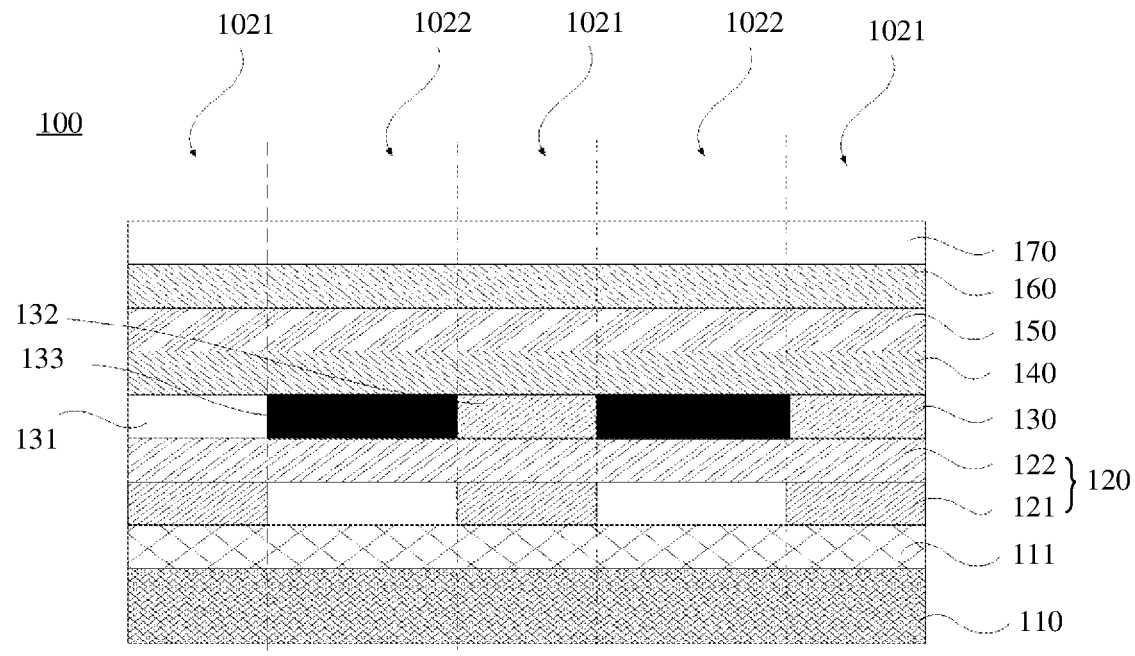
Figures 14, 15:
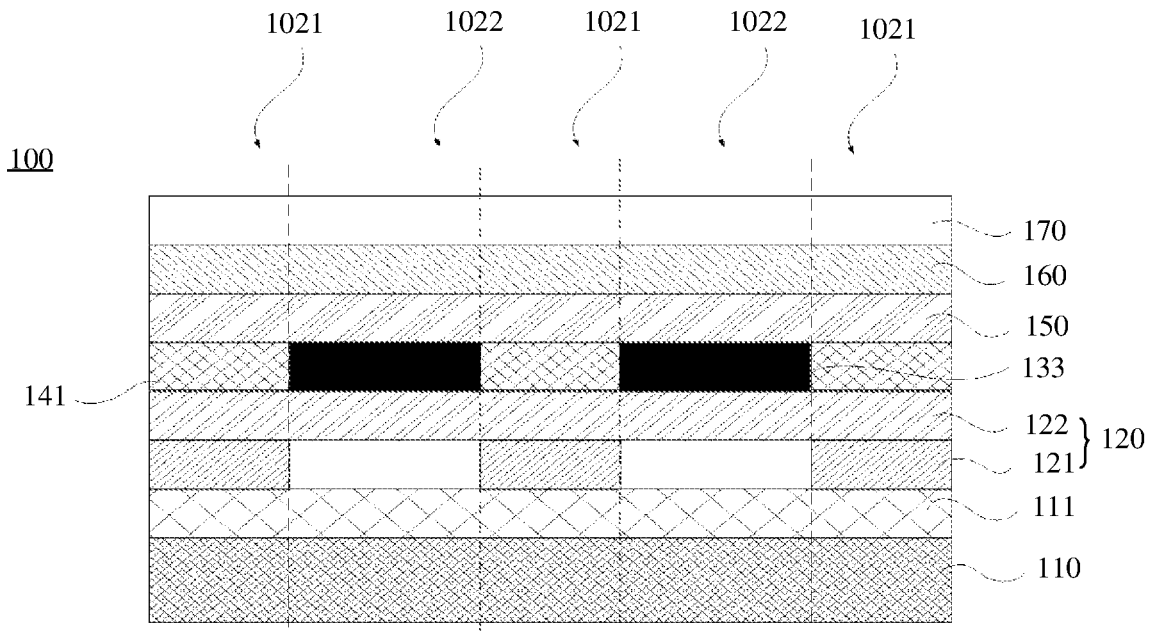
Figure 16:
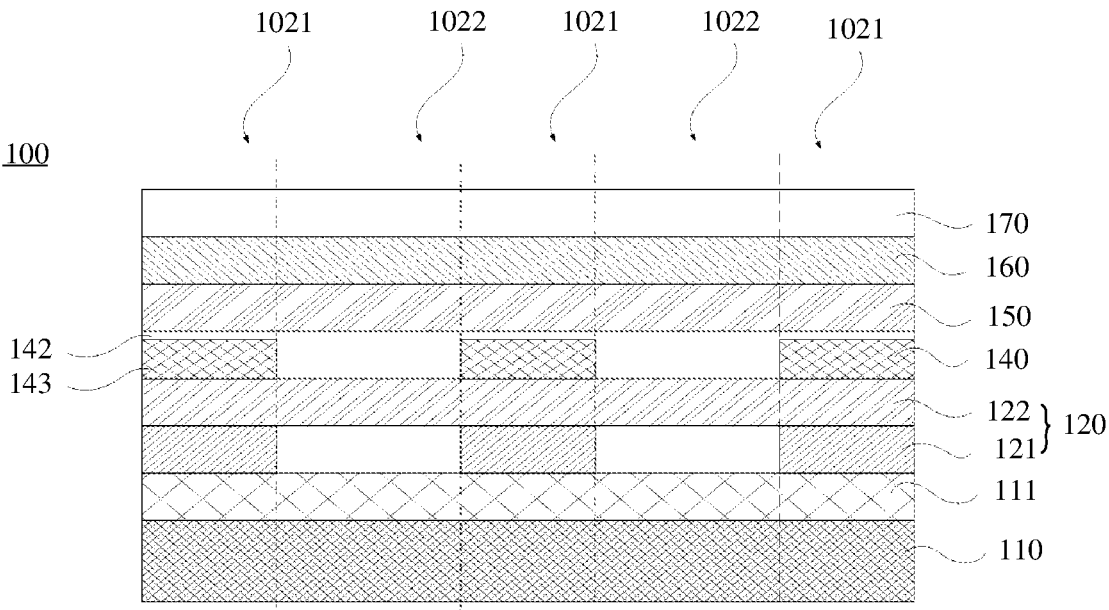

FIG. 2 is a sectional view of a display module according to an embodiment of this application;

FIG. 3 is a principle diagram of a light enhancement layer according to an embodiment of this application;

FIG. 4 to FIG. 9 are flowcharts of producing a display module according to an embodiment of this application;

FIG. 10 is a sectional view of another display module according to an embodiment of this application;

FIG. 11 is a sectional view of another display module according to an embodiment of this application;

FIG. 12 is a sectional view of another display module according to an embodiment of this application;

FIG. 13 is a sectional view of another display module according to an embodiment of this application;

FIG. 14 is a sectional view of another display module according to an embodiment of this application;

FIG. 15 is a sectional view of another display module according to an embodiment of this application; and FIG. 16 is a sectional view of another display module according to an embodiment of this application.

DESCRIPTION OF EMBODIMENTS

The following further describes embodiments of this application with reference to the accompanying drawings.

For ease of understanding and for ease of description, an OLED display module provided in embodiments of this application is briefly referred to as a display module below. An application scenario of the display module provided in embodiments of this application is first described. The display module provided in embodiments of this application may be applied to a display apparatus, and may be specifically applied to a mobile phone, a tablet computer, an electronic watch, or another common terminal product that can provide display.

Terms related to this application are first described.

Molecules of a cholesteric liquid crystal are flat and arranged into layers. Molecules at a layer are parallel to each other, and a major axis of the molecule is parallel to a plane of the layer. Directions of major axes of molecules at different layers slightly change, and the molecules are arranged into a spiral structure in normal directions of the layers. A pitch of the cholesteric liquid crystal is approximately 300 nm, and is in a same order of magnitude as a visible light wavelength. A reflection center wavelength and a width of the cholesteric liquid crystal are determined by $n_e/n_o$ of the liquid crystal. The center wavelength=$n_{ave}$×the pitch, the width=($n_e$−$n_o$)×the pitch, and $n_{ave}^2$=($n_e^2$+2$n_o^2$)/3. The pitch is adjusted based on a concentration of doped chiral molecules. A higher concentration indicates a smaller pitch, and a lower concentration indicates a larger pitch. $n_e$ is a refractive index of the cholesteric liquid crystal to e light (extraordinary light). $n_o$ is a refractive index of the cholesteric liquid crystal to o light (ordinary light). $n_{ave}$ is an average refractive index. The pitch (pitch) is a distance in a z direction when a guide axis n of the molecule of the cholesteric liquid crystal is rotated for 2π along a Z axis. The extraordinary light and the ordinary light are two kinds of polarized light that vibrate vertically with each other and that are produced when light penetrates into the cholesteric liquid crystal and generates birefringence.

Figure 1:
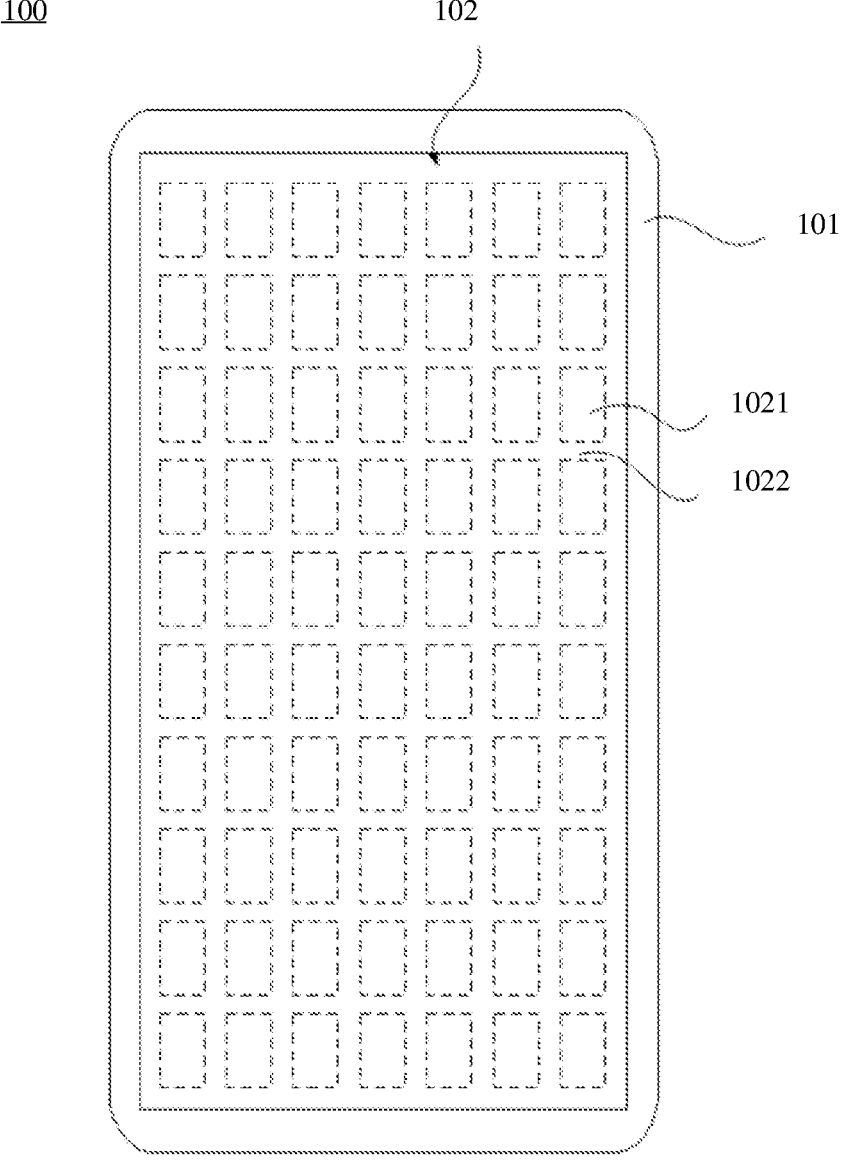
FIG. 1 is a top view of a display module according to an embodiment of this application.

FIG. 1 is a top view of a display module 100 according to an embodiment of this application. A light-emitting surface of the display module 100 is divided into a display area 102 and a non-display area 101. The display area 102 is configured to implement a display function of the display module 100. The non-display area 101 is disposed around the display area 102, and is configured to block a metal wire of an internal structure of the display module 100. This embodiment of this application relates to only the display area 102, and a structure of the display module 100 in the non-display area 101 is not specifically limited or described.

The display area 102 is further divided into pixel areas 1021 and a non-pixel area 1022. The pixel areas 1021 are configured to display an image, and the non-pixel area 1022 is configured to block the wire in the display module 100. As shown in FIG. 1, the non-pixel area 1022 and the pixel areas 1021 are arranged into a mesh structure, and the pixel areas 1021 are located in meshes formed by the non-pixel area 1022. The pixel areas 1021 and the non-pixel area 1022 are marked by using dashed lines, to represent the internal structure of the display module. The pixel areas 1021 and the non-pixel area 1022 are structures at a display layer in the display module. Pixels are correspondingly disposed in the pixel areas 1021 at the display layer, and the pixel is used to emit a light ray of a corresponding color from the pixel areas 1021, to implement the display function of the display module 100. Each pixel corresponds to one pixel area 1021. The pixels may be pixels of different types. For example, the pixels may be a red pixel, a green pixel, a blue pixel, a white pixel, and the like.

FIG. 2 is a sectional view of the display module 100. The display module 100 is of a multi-layer structure, and layers are stacked in a first direction. The first direction is a direction perpendicular to the light-emitting surface of the display module 100. A main structure of the display module 100 may include the display layer 120 and a circular polarizer 150 that are stacked, and a light enhancement layer 140 and a light absorption layer 130 that are stacked. The light enhancement layer 140 and the light absorption layer 130 that are stacked are disposed between the display layer 120 and the circular polarizer 150. The light enhancement layer 140 is configured to increase luminosity of the display module 100, and the light absorption layer 130 is configured to reduce reflected light of an external light ray on the display module 100. The following describes the structure of the display module 100 in detail with reference to FIG. 2.

A substrate 110 serves as a base layer structure that carries other layers of the display module 100, and another structure of the display module 100 may be directly disposed on the substrate 110. In an optional solution, the substrate 110 may be made of a common material, for example, a resin, an organic material, or glass. This is not specifically limited herein. The substrate 110 carries a circuit layer 111. The circuit layer 111 shown in FIG. 2 is laid on the substrate 110, and is configured to supply power to the display layer 120. The wire blocked by the non-pixel area 1022 described above is a part of wires at the circuit layer 111.

The display layer 120 is disposed on the substrate 110, and serves as a layer structure for implementing the display function in the display module 100. The display layer 120 includes a light emitting layer 121 and an encapsulation layer 122. The light emitting layer 121 is disposed on a side that is at the circuit layer 111 and that is away from the substrate 110, and emits light rays of various colors based on control of the circuit layer 111. The light emitting layer 121 includes various types of pixels such as a red pixel, a blue pixel, and a green pixel. The various types of pixels may be referred to as pixels of the display module 100. It should be understood that, when the display module 100 includes another type of pixel, a corresponding pixel is correspondingly disposed at the light emitting layer 121. The pixels are arranged at intervals on a plane perpendicular to the first direction. An area in which the pixels are disposed is the pixel area 1021, an area between any two adjacent pixels is the non-pixel area 1022, and the pixel areas 1021 and the non-pixel area 1022 are arranged into an array shown in FIG. 1. It can be learned with reference to FIG. 1 and FIG. 2 that an arrangement direction of the pixel areas 1021 and the non-pixel area 1022 is perpendicular to a stacking direction of the display layer 120 and the circular polarizer 150.

The encapsulation layer 122 covers the light emitting layer 121, and serves as a protective layer of the light emitting layer 121. The encapsulation layer 122 is located on a surface that is of the light emitting layer 121 and that is away from the circuit layer 111, and may be directly formed at the light emitting layer 121. In an example, the encapsulation layer 122 may be made of a resin or another light transmission material.

The light absorption layer 130 is disposed on a surface that is of the encapsulation layer 122 and that is away from the circuit layer 111, and covers the display layer 120. All light rays emitted from the display layer 120 pass through the light absorption layer 130, and the light absorption layer 130 selectively absorbs the light ray emitted from the display layer 120. Absorption of the light ray by the light absorption layer 130 means that the light ray is converted into energy in another form when being irradiated to the light absorption layer 130. For example, the light absorption layer 130 is configured to transmit a light ray emitted from the pixel area 1021 of the display layer 120, and absorb a light ray emitted from the non-pixel area 1022 of the display layer 120. In an optional solution, the light absorption layer 130 includes two areas: a black area and a light transmission area. Arrangement of the black area and the light transmission area is similar to arrangement of the pixel areas 1021 and the non-pixel area 1022, to form a mesh structure. The black area corresponds to the non-pixel area 1022, and a light ray emitted by the display layer 120 from the non-pixel area 1022 may be absorbed by the black area of the light absorption layer 130, and therefore cannot pass through the light absorption layer 130. It should be understood that the light ray emitted by the display layer 120 from the non-pixel area 1022 is a light ray that enters the non-pixel area 1022 after being scattered or reflected. The light transmission area corresponds to the pixel area 1021, the light transmission area has no impact on a light ray, and a light ray emitted by the display layer 120 from the pixel area 1021 may directly pass through the light transmission area.

In an optional solution, the light absorption layer 130 may be configured to absorb light rays of different bands. For example, the light absorption layer 130 may absorb a blue light band, a green light band, a red light band, or another band of visible light. When the light absorption layer 130 shown in FIG. 3 includes the black area, the black area of the light absorption layer 130 may absorb all bands of visible light emitted from the non-pixel area 1022, for example, it may absorb the red light band, the green light band, the blue light band, or another band of the visible light.

The light enhancement layer 140 is disposed on a surface that is of the light absorption layer 130 and that is away from the circuit layer 111. The light enhancement layer 140 is configured to transmit a light ray in a first polarization state, and is configured to reflect a light ray in a second polarization state to the metal wire (including but not limited to the circuit layer 111 and a cathode and an anode at the display layer 120) of the display module 100, so that the light ray in the second polarization state is reflected again by the metal wire to form a light ray in the first polarization state that can pass through the circular polarizer 150. The light ray in the first polarization state and the light ray in the second polarization state are light rays emitted from the light emitting layer 121, and the light rays in the two polarization states that are emitted from the light emitting layer 121 pass through the light absorption layer and are irradiated to the light enhancement layer 140. The light ray in the first polarization state and the light ray in the second polarization state are two types of polarized light corresponding to the circular polarizer 150. For example, the light ray in the first polarization state may be a left-polarized light ray, and the light ray in the second polarization state may be a right-polarized light ray, or the light ray in the first polarization state is a right polarized light ray, and the light ray in the second polarization state is a left-polarized light ray.

When the foregoing structure in which the light enhancement layer 140 is close to the circular polarizer 150 and the light absorption layer 130 is closer to the display layer 120 than the light enhancement layer 140 is used, a light ray absorbed by the light absorption layer 130 is prevented from passing through the light enhancement layer 140.

In an optional solution, the light enhancement layer 140 is bonded to the light absorption layer 130, to facilitate a fixed connection between the light enhancement layer 140 and the light absorption layer 130.

In an optional solution, the light enhancement layer 140 may be a cholesteric liquid crystal layer. For a light ray of a specific wavelength, the cholesteric liquid crystal layer may transmit the light ray in the first polarization state, and reflect the light ray in the second polarization state. A wavelength range of a light ray on which the cholesteric liquid crystal layer acts is determined by a product of a refractive index difference $\Delta n$ of liquid crystal molecules and a pitch of the liquid crystal molecule. For example, a light band enhanced by the light enhancement layer 140 includes a blue light band, a green light band, a red light band, or another band of visible light.

Still refer to FIG. 2. The circular polarizer 150 is disposed on a surface that is of the light enhancement layer 140 and that is away from the light absorption layer 130. The circular polarizer 150 is configured to transmit the light ray in the first polarization state that is emitted from the light emitting layer 121, and is configured to absorb the light ray in the second polarization state that is emitted from the light emitting layer 121. When the light enhancement layer 140 cooperates with the metal wire, the light ray in the second polarization state may be converted into a light ray in the first polarization state through two times of reflection, so that the light ray in the second polarization state that is originally blocked by the circular polarizer 150 can be converted into the light ray in the first polarization state that can pass through the circular polarizer 150. This increases an amount of light output by the display module 100, thereby increasing display brightness of the display module 100.

In an optional solution, the light enhancement layer 140 is bonded to the circular polarizer 150, to facilitate fixation of the light enhancement layer 140.

To protect an inner layer structure of the display module 100, the display module 100 further includes a cover 170. The cover 170 covers a side that is of the circular polarizer 150 and that is away from the light enhancement layer 140, and serves as a protection structure of the entire display module 100. For example, the cover 170 may be made of a common material, for example, glass or light transmission resin. Details are not described herein again. During specific connection, the cover 170 is bonded to the circular polarizer 150 by using a bonding layer 160.

For ease of understanding light enhancement effect of the light enhancement layer provided in this embodiment of this application, the following describes in detail principles of the light enhancement layer 140 and the light absorption layer 130.

FIG. 3 shows an example of a principle diagram of the light enhancement layer 140. In natural light emitted from the display module, 50% of the light rays are light rays in the second polarization state that cannot pass through the circular polarizer 150, and 50% of the light rays are light rays in the first polarization state that can pass through the circular polarizer 150. When the natural light is irradiated to the light enhancement layer 140, the light ray in the first polarization state is emitted after passing through the light enhancement layer 140 and the circular polarizer 150 in sequence. After being reflected by the light enhancement layer 140, the light ray in the second polarization state is irradiated to the metal wire in the display module, and is converted into a light ray in the first polarization state after being reflected by the metal wire. When being irradiated to the light enhancement layer 140 again, the light ray in the first polarization state may pass through the light enhancement layer 140 and the circular polarizer 150. It can be learned from the foregoing descriptions that, through the two times of reflections by the disposed light enhancement layer 140 and the metal wire in the display module, the light ray in the second polarization state that originally cannot pass through the circular polarizer 150 can be converted into the light ray in the first polarization state that can pass through the circular polarizer 150. This increases the amount of the light output by the display module, thereby improving display effect of the display module.

However, after the light enhancement layer 140 is added, reflection effect of the display module after the external light ray is irradiated to the display module is inevitably increased. A principle of increasing the reflection effect is similar to a principle of increasing, by the light enhancement layer 140, the amount of the light output by the display module: When the external natural light is irradiated to the display module, the light ray in the first polarization state passes through the circular polarizer 150, then penetrates into the display module, and becomes a light ray in the second polarization state after being reflected by a metal layer in the display module. If there is no light enhancement layer 140, the light ray in the second polarization state obtained through conversion is absorbed by the circular polarizer 150, and reflection of the external natural light by the display module has less impact on the display module. However, after the light enhancement layer 140 is added, the light ray in the second polarization state that is formed after being reflected by the metal wire may be reflected to the metal wire again by using the light enhancement layer 140, is converted into the light ray in the first polarization state after being reflected by the metal wire again, and therefore can be emitted after passing through the circular polarizer 150. This increases the reflection effect of the display module. As a result, after the external light ray is irradiated to the display module, the reflection effect of the display module is increased, and normal display of the display module is affected. Therefore, the light absorption layer is added in this application. When structures of the black area and the light transmission area are used at the light absorption layer, the light ray in the first polarization state that is irradiated to the non-pixel area may be absorbed by using the black area, so that the light ray in the first polarization state that originally intends to pass through the circular polarizer 150 can be absorbed, to reduce the reflection effect. In addition, in the pixel area, the light transmission area is used at the light absorption area. This does not affect normal display of the display module.

In an optional solution, a light band absorbed by the light absorption layer 130 is the same as the light band enhanced by the light enhancement layer 140. When a light ray enhanced by the light enhancement layer 140 is emitted from the non-pixel area 1022, the enhanced light ray may be absorbed by the light absorption layer 130.

It can be learned from the foregoing descriptions that a polarization state of the light ray emitted from the display layer is changed through cooperation between the light enhancement layer 140 and the metal wire in the display layer, so that more light rays can pass through a circular polarizer 150, to improve brightness of the display module. In addition, the disposed light absorption layer absorbs the reflected light of the external light ray on the display module, to suppress reflection of the external light ray and improve the display effect of the display module. For ease of understanding the effect of the display module provided in this embodiment of this application, the display module provided in this embodiment of this application is tested. The effect of the display module is shown in Table 1 and Table 2.

TABLE 1

| Light output gain comparison | | | | | |
|---|---|---|---|---|---|
| Test item | | White | Red | Green | Blue |
| Lv (cd/m²) | Light enhancement layer (blue light) + circular polarizer | 517.55 | 164.79 | 418.22 | 45.457 |
| | Circular polarizer only | 481.35 | 163.52 | 406.48 | 41.557 |
| | Light enhancement layer (visible light) + circular polarizer | 700.76 | 234.5 | 616.89 | 48.541 |

TABLE 2

| | Circular polarizer | Circular polarizer + light enhancement layer (blue light) | Circular polarizer + light enhancement layer (blue light) + light absorption layer | Circular polarizer + light enhancement layer (visible light) | Circular polarizer + light enhancement layer (visible light) + light absorption layer |
|---|---|---|---|---|---|
| | | | Reflection suppression comparison | | |
| R % (AV) | 5.128 | 6.327 | 4.839 | 9.099 | 5.229 |
| L | 26.5 | 28.11 | 25.82 | 38.07 | 27.25 |
| A | −0.07 | 6.92 | 0.43 | −5.82 | −0.5 |
| B | −1.24 | −15.47 | −1.69 | 0.05 | −0.6 |

It can be learned from Table 1 that the two display modules with different light enhancement layers provided in this embodiment of this application are compared with a display module (including only the circular polarizer) in the conventional technology. Light output effect is significantly improved, and the measured luminance Lv of a white image is increased by 45.5%. It can be learned from Table 2 that, compared with that in the conventional technology, a reflectivity can be decreased from 10.62% to 5.23% (a reflectivity of an existing circular polarizer solution is 5.12%).

In conclusion, in the display module provided in this embodiment of this application, the light output effect can be effectively improved by using the light enhancement layer. In addition, the reflectivity can be effectively reduced by using the disposed light absorption layer. In addition, compared with another structure for improving brightness and reflection of a display module, only two film layers are required by the display module provided in this embodiment of this application, have little impact on the display module, and improve the light output effect and the reflection effect of the display module without affecting a thickness of the display module.

For ease of understanding the structure of the display module provided in this embodiment of this application, the following describes how to assemble each layer structure with reference to a specific production method of the display module.

Step 001: Form the light enhancement layer.

Figure 4:
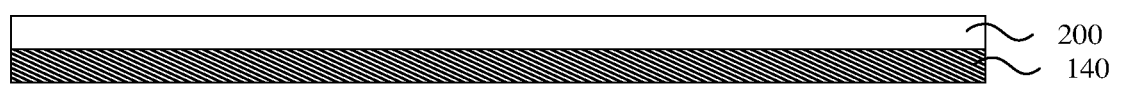

Refer to FIG. 4. The light enhancement layer 140 may include a cholesteric liquid crystal and a substrate 200. During production, an alignment layer is first coated on the substrate 200, and then the cholesteric liquid crystal layer is coated. A coating thickness may range from 1 μm to 5 μm. For example, the coating thickness is different, for example, 1 μm, 2 μm, 3 μm, 4 μm, or 5 μm. An alignment process applied to the cholesteric liquid crystal may be friction alignment, light alignment, or liquid crystal self-assembly. A light band reflected by the light enhancement layer 140 may include a band of separate light such as red light, blue light, and green light, or any combination thereof, or may include an entire visible light band.

In an optional solution, the substrate 200 may be a circular polarizer, cellulose triacetate, a cycloolefin polymer, glass (a thickness ranges from 0.02 mm to 0.5 mm), a composite polymer film, or the like.

Alignment Process

1. Friction alignment: The substrate 200 is placed on a bearing platform, and a surface coated with an alignment film faces upward. The bearing platform is combined with a driving mechanism, and the driving mechanism drives the bearing platform to perform straight-line conveyance towards a direction indicated by an arrow. A roller with a surface attached with a cloth is disposed on a conveying path of the substrate 200. When the substrate 200 passes through the roller, the roller performs rolling friction on the alignment film on the surface of the substrate 200 in a clockwise rolling manner in which a tangent speed direction at the bottom of the roller is opposite to the moving direction of the substrate 200. Molecules on a surface of the alignment film after friction alignment are no longer scattered, but present an interface condition of uniform arrangement, so that the liquid crystal can be arranged in a predetermined direction.

2. Light alignment: The light alignment belongs to non-contact alignment. Ultraviolet light in a high-precision real-time tracking compensation mode is used to make a photo-sensitive polymer monomer material chemically react to generate anisotropy. Liquid crystal molecules interact with molecules on a surface of an alignment film. To achieve a stable state with minimum energy, the liquid crystal mol-ecules are arranged in a direction, that is defined by light alignment, with maximum stress.

Step 002: Attach the circular polarizer to the light enhancement layer.

Figure 5:
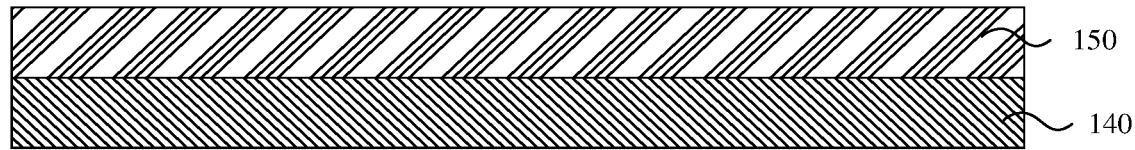

Refer to FIG. 5. If the light enhancement layer 140 is not directly coated on the circular polarizer 150, the light enhancement layer 140 is attached to a phase compensation film surface of the circular polarizer 150 by using an optically clear adhesive or a pressure-sensitive adhesive.

Step 003: Produce the display layer 120.

Figure 6:
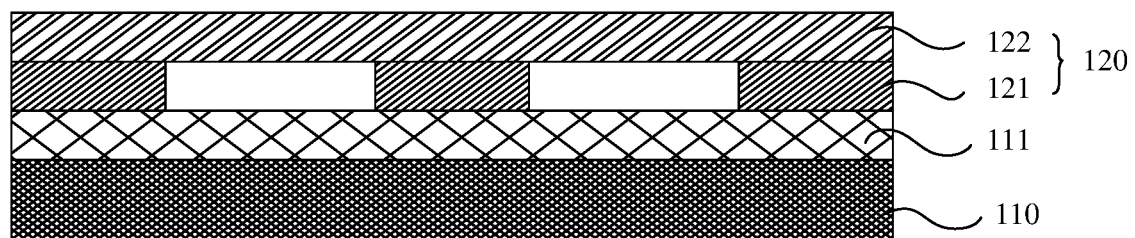

Refer to FIG. 6. The light emitting layer 121 and the encapsulation layer 122 are laid on the substrate 110 in sequence. The light emitting layer 121 is disposed at the circuit layer 111 of the substrate 110, and emits the light rays of the various colors based on control of the circuit layer 111. The light emitting layer 121 includes the pixels of the display module, such as the red pixel, the blue pixel, and the green pixel. Certainly, it should be understood that, when the display module includes the another type of pixel, the corresponding pixel is correspondingly disposed at the light emitting layer 121. The encapsulation layer 122 is located on the surface that is of the light emitting layer 121 and that is away from the circuit layer 111, and may be directly formed at the light emitting layer 121. In an example, the encapsu-lation layer 122 may be made of the resin or the another light transmission material.

Step 004: Produce the light absorption layer.

Figure 7:
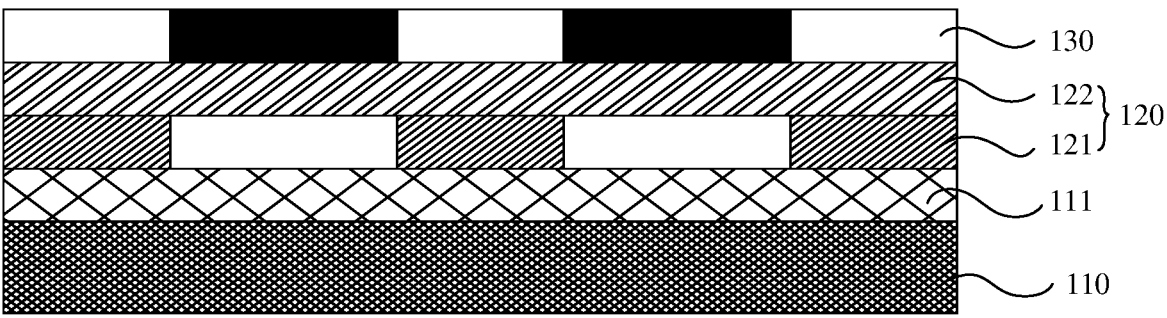

Refer to FIG. 7. After the display layer 120 is produced, if the light enhancement layer acts on the entire visible light band, a black photosensitive adhesive layer is produced on the upper surface of the display as the light absorption layer 130. A black photoresist is coated, and then a part corre-sponding to the pixel area is etched off, so that the black area correspondingly blocks a part of the non-pixel area.

Step 005: Attach the display to the circular polarizer.

Figure 8:
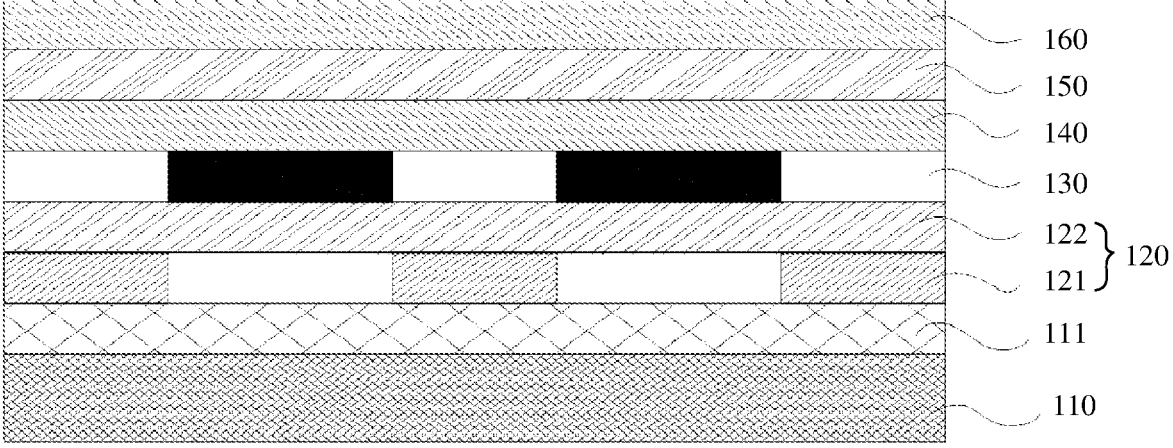

Refer to FIG. 8. The display module for which the light absorption layer 130 has been produced is attached to the circular polarizer 150 (which has been coated with the light enhancement layer 140 or attached to the light enhancement layer 140) by using a photosensitive adhesive or a pressure-sensitive adhesive. The light enhancement layer 140 is located between the light absorption layer 130 and the circular polarizer 150.

Step 006: Attach the cover.

Figure 9:
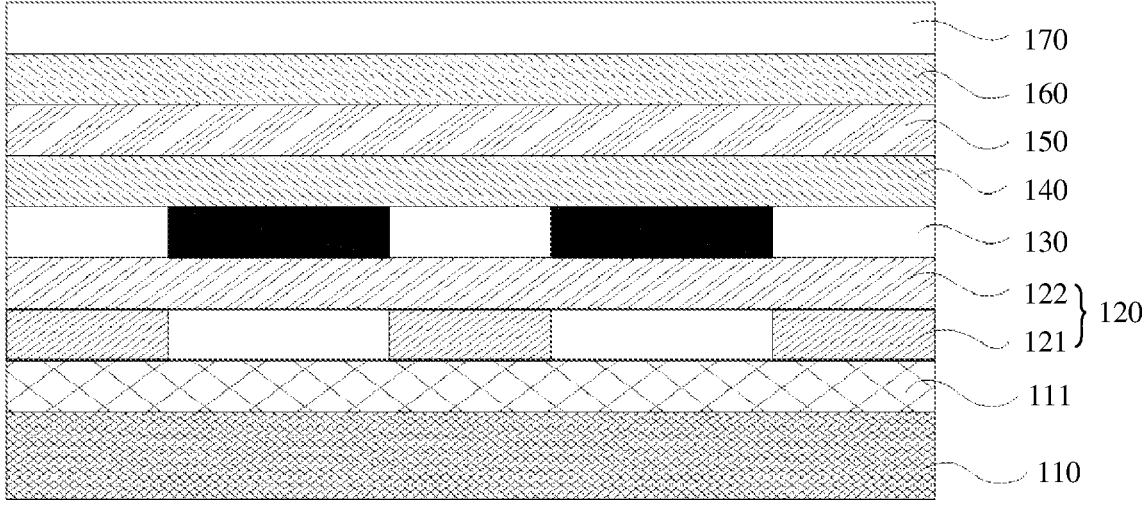

Refer to FIG. 9. The cover 170 is attached to the circular polarizer 150 by using a photosensitive adhesive.

Each layer structure in the display module can be pro-duced by using the foregoing production method. Through cooperation between the produced light enhancement layer and light absorption layer, the display module can reduce reflection of the external light ray when improving the light output effect of the display module.

Refer to FIG. 10. Based on the display module shown in FIG. 2, another implementable structure of the light enhancement layer 140 is provided. In addition to the foregoing cholesteric liquid crystal, the light enhancement layer 140 may be alternatively a material layer with a microstructure 141. The microstructure 141 is a nanostruc-ture capable of implementing circularly polarized light selection. For example, the microstructure 141 may transmit a light ray in a first polarization state in a light ray of a specific frequency band, and reflect a light ray in a second polarization state.

During specific disposition, the microstructure 141 may be a parallelogram or circular array, and the light ray in the second polarization state can be reflected regardless of whether the parallelogram array or the circular array is used.

In a specific implementable solution, the material layer is an organic material layer. The organic material layer may be made of a metal oxide or a nitride, for example, $TiO_2$, $Ta_2O_5$, $HfO_2$, or $Si_3N_4$.

FIG. 11 shows another display module according to an embodiment of this application. For some reference numer-als in FIG. 11, refer to the same reference numerals in FIG. 2.

Based on the example shown in FIG. 2, another manner of disposing the light enhancement layer 140 and the light absorption layer 130 is provided. The following describes only the light enhancement layer 140 and the light absorp-tion layer 130 that are shown in FIG. 11. For another layer structure of the display module, refer to related descriptions in FIG. 2.

In FIG. 11, the light enhancement layer 140 acts on a blue light band. When a cholesteric liquid crystal is selected for the light enhancement layer 140, a wavelength range of a light ray on which a cholesteric liquid crystal layer acts is determined by a product of a refractive index difference $\Delta n$ between liquid crystal molecules and a pitch (pitch) of the liquid crystal molecule. It is determined, by using the refractive index difference $\Delta n$ between the cholesteric liquid crystal molecules and the pitch (pitch) of the liquid crystal molecule, that the light enhancement layer 140 acts on the blue light band. During use, a light ray in a second polar-ization state is reflected only when blue light is irradiated to the light enhancement layer 140. When a light ray in another frequency band is irradiated to the light enhancement layer 140, the light enhancement layer 140 does not correspond-ingly reflect the light ray.

In FIG. 11, for example, the display layer includes a blue pixel, a red pixel, and a green pixel. The pixel area of the display module includes at least a blue pixel area, a red pixel area, and a green pixel area. When the light enhancement layer 140 is disposed, the light enhancement layer 140 covers the pixel area. However, it should be understood that, although the light enhancement layer 140 covers the red pixel area and the green pixel area, the light enhancement layer 140 does not correspondingly reflect red light or green light.

In an optional solution, the light absorption layer 130 is divided into two areas: a light transmission area 131 and a yellow area 132. The light transmission area 131 corre-sponds to the blue pixel area, and the yellow area 132 corresponds to another pixel area and is configured to absorb the blue light ray. The light transmission area 131 is disposed above the blue pixel, to prevent a light ray emitted from the blue pixel from being absorbed by the light absorption layer 130, so as to prevent display of the display module from being affected. The yellow area 132 that can absorb the blue light ray is disposed in another area, to ensure that the blue light ray can be absorbed by using the another area, so as to reduce reflection effect of the display module on an external light ray.

In the foregoing embodiment, the yellow light is used as an example. When the light enhancement layer 140 acts on a light ray of another color, the light enhancement layer 140 and the light absorption layer 130 respectively satisfy: The light enhancement layer 140 can reflect a light ray that is in the second polarization state and that is of the color, and transmit a light ray that is in a first polarization state and that is of the color, and the light absorption layer 130 includes a light transmission area corresponding to a pixel area that corresponds to the color, and a light absorption area that can absorb the light ray of the color and that covers another area of the display module.

FIG. 12 shows a manner of disposing the light enhancement layer 140 and the light absorption layer 130 in another display module. A difference between FIG. 12 and FIG. 11 lies only in a manner of disposing the light absorption layer 130.

In an optional solution, the light absorption layer 130 includes a light transmission area 131 corresponding to a blue pixel area, a black area 133 corresponding to the non-pixel area 1022, and a yellow area 132 corresponding to another pixel area. It can be learned by comparing FIG. 11 with FIG. 12 that the light absorption layer 130 in FIG. 12 absorbs a light ray in the non-pixel area 1022 by using the black area 133, and can also achieve effect of absorbing yellow light.

With reference to the structures shown in FIG. 2, FIG. 11, and FIG. 12, it can be learned that the display module provided in this embodiment of this application can improve the light output effect of the display module and reduce the reflection effect of the display module by using the light enhancement layer 140 and the light absorption layer 130. During improvement, light rays of all frequency bands may be improved, or a light ray of a specific type may be improved in a targeted manner. For example, if blue light output effect of the display module is poor, the blue light may be improved. For details, refer to FIG. 11 and FIG. 12. Through cooperation between the light absorption layer 130 and the light enhancement layer 140, overall light output effect of the display module can be flexibly improved.

FIG. 13 is a schematic diagram of a structure of another display module 100 according to an embodiment of this application. Based on the display module 100 shown in FIG. 2, the display module 100 shown in FIG. 13 provides another manner of disposing the light enhancement layer 140.

For the display layer 120 and the circular polarizer 150 of the display module 100 in FIG. 13, refer to related descriptions in FIG. 2. Details are not described here again.

The light enhancement layer 140 is disposed in a same manner as the pixel area of the display module 100. The light enhancement layer 140 includes a light enhancement area 141 corresponding to the pixel area. The light enhancement area 141 is configured to transmit a light ray in the first polarization state, and is configured to reflect a light ray in the second polarization state to the metal wire in the display module 100, so that the light ray in the second polarization state is reflected again to form a light ray in the first polarization state that can pass through the circular polarizer 150.

In an optional solution, the light enhancement layer 140 further includes a protective layer 142, and the protective layer 142 is filled in a gap between the light enhancement areas 141 and covers the light enhancement areas 141. In an example, the protective layer 142 may be made of a common material, for example, polyimide or acrylic.

In an optional solution, the light enhancement area 141 of the light enhancement layer 140 is filled with a cholesteric liquid crystal. The cholesteric liquid crystal corresponds to a light ray of a specific wavelength, and a cholesteric liquid crystal layer may transmit the light ray in the first polarization state and reflect the light rays in the second polarization state. A wavelength range of a light ray on which the cholesteric liquid crystal layer acts is determined by a product of a refractive index difference Δn between liquid crystal molecules and a pitch (pitch) of the liquid crystal molecule. For example, a light band enhanced by the light enhancement layer 140 includes a blue light band, a green light band, a red light band, or a visible light band. When the light enhancement areas 141 are in a one-to-one correspondence with the pixels, a light ray that can be enhanced by the light enhancement area 141 corresponding to each pixel corresponds to a light ray emitted from the pixel. The red pixel, the green pixel, and the blue pixel that are shown in FIG. 7 are used as an example. The light rays correspondingly enhanced by the light enhancement areas 141 are respectively red light, green light, and blue light. For ease of description, light rays corresponding to the red pixel, the green pixel, and the blue pixel are respectively named a first light enhancement area, a second light enhancement area, and a third light enhancement area. The red pixel corresponds to the first light enhancement area, the blue pixel corresponds to the second light enhancement area, and the green pixel corresponds to the third light enhancement area.

The red pixel and the corresponding first light enhancement area are used as an example to describe a correspondence between the red pixel and the corresponding first light enhancement area. In a first direction, the first light enhancement area is stacked with the red pixel, and covers the red pixel, to ensure that a light ray emitted from the red pixel passes through the first light enhancement area. The first light enhancement area may transmit a light ray that is in the first polarization state and that is of the red light ray, and reflect a light ray that is in the second polarization state. After being reflected again by the metal wire in the display module 100, the reflected light ray in the second polarization state may be converted into a light ray in the first polarization state, and may pass through the first light enhancement area. Similarly, the second light enhancement area and the third light enhancement area may respectively implement the foregoing transmission and reflection effect on a blue light ray and a green light ray. When the first light enhancement area, the second light enhancement area, and the third light enhancement area are specifically implemented, different cholesteric liquid crystals may be filled in the first light enhancement area, the second light enhancement area, and the third light enhancement area.

When an external light ray passes through the light enhancement area 141 and is irradiated to the metal wire in the display module 100, a light ray reflected by the metal wire is irradiated to the non-pixel area. However, because the non-pixel area includes only the protective layer 142, and a light ray in the second polarization state is not reflected by the protective layer 142, the light ray in the second polarization state cannot be converted into a light ray in the first polarization state, and the light ray in the second polarization state irradiated to the non-pixel area is absorbed by the circular polarizer 150. In this way, the reflection effect of the display module 100 is reduced.

It can be learned from the foregoing descriptions that, when an area that is in the light enhancement layer 140 and that is configured to reflect a light ray corresponds to the pixel, compared with that in the embodiment shown in FIG. 2, when there is no light absorption layer, the light output effect of the display module 100 can also be increased, and the reflection effect on the external light ray can also be reduced.

For ease of understanding the display module provided in this embodiment of this application, an embodiment of this application further provides a production method of the display module. Details are as follows.

Step 001: Coat and align the light enhancement layer.

The light enhancement layer is regularly arranged through light alignment or liquid crystal self-assembly to reach an orientation state, and a thickness of the light enhancement layer is 2 μm to 5 μm. A band on which the light enhancement layer used herein acts is one of the red light, the green light, and the blue light.

Step 002: Pattern the light enhancement layer. After the liquid crystal molecules are oriented, the molecules are arranged based on an orientation. In this case, a mask is placed above a liquid film, and a light source that induces the oriented molecules to polymerize is placed above the mask. In this case, only a part that is not blocked by the mask can be irradiated and polymerized, and a thin film blocked by the mask is not polymerized. A monomer molecule that is not polymerized may be cleaned and removed by using a solvent. In this way, a patterned light enhancement layer is formed. In the present invention, the light enhancement layer that is not blocked by the mask, that is, is reserved, is located above a corresponding sub-pixel.

The mask is also referred to as a photomask or a mask in the industry, the mask or the photomask in English.

Step 003: Repeat Step 001 and Step 002, and separately coat and pattern the light enhancement layers of the R, G, and B bands as required. A production process is the same as those in Steps 001 and 002. Finally, any combination of the three light enhancement layers may be obtained.

Step 004: Coat the protective layer.

A photosensitive adhesive is coated, as a protective and planarizing layer, above a display on which the patterned light enhancement layer is produced.

Step 005: Attach the circular polarizer to a glass cover.

A part that is of the display module and that is produced and the circular polarizer are attached to the glass cover in sequence.

In the display module produced by using the foregoing method, R, G, and B may be separately or uniformly enhanced as required. If R, G, and B are all enhanced, light output effect may be improved by 50% or above. In addition, a reflectivity of the display module may be further decreased to 4.9%.

FIG. 14 shows an example of a structure of another display module. The light enhancement layer is combined with a light absorption layer based on the display module shown in FIG. 13. The display module further includes the light absorption layer. The light absorption layer includes a black area 133 corresponding to the non-pixel area and a light transmission area corresponding to the pixel area. A light enhancement area 141 of the light enhancement layer is filled in the light transmission area. When the foregoing structure is used, the light absorption layer and the light enhancement layer are integrated into one layer structure. A structure located in the pixel area is the light enhancement area 141 corresponding to the light enhancement layer, and a structure located in the non-pixel area is the black area 133 of the light absorption layer. A black light absorption area is disposed in the non-pixel area, so that a light ray in a first polarization state and a light ray in a second polarization state can be both absorbed, to further improve effect of reducing reflection of an external light ray.

FIG. 15 shows an example of a structure of another display module 100. The light enhancement layer is improved based on the display module 100 shown in FIG.

13. For some reference numerals in FIG. 15, refer to the same reference numerals in FIG. 13.

A light enhancement area 143 of the display module 100 may correspond to a visible light ray of all bands. During specific production, a cholesteric liquid crystal in the light enhancement area 143 may transmit the visible light of all the bands.

During specific production, a cholesteric liquid crystal in the light enhancement layer 140 above the pixel area 1021 is orientated to act on an entire visible light band. A cholesteric liquid crystal in the non-pixel area 1022 may be heated to be disordered, to form a disordered liquid crystal 144 that does not reflect a light ray in the second polarization state, so as to change an optical feature of the cholesteric liquid crystal.

FIG. 16 shows an example of a structure of another display module. The light enhancement layer 140 is improved based on the display module shown in FIG. 15. The cholesteric liquid crystal in the non-pixel area 1022 may be washed out by using a solvent. Similarly, light output effect of the display module can be improved, and reflection effect on an external light ray can be reduced.

In an optional solution, the light enhancement layer shown in FIG. 13 to FIG. 16 may be alternatively made of a material layer with a microstructure. The microstructure is a nanostructure capable of implementing circularly polarized light selection. For example, the microstructure may transmit a light ray in the first polarization state in a light ray of a specific frequency band, and reflect a light ray in a second polarization state.

During specific disposition, the microstructure is disposed only in the light enhancement area, without being disposed in another area. In a specific example, the microstructure may be a parallelogram or circular array, and the light ray in the second polarization state can be reflected regardless of whether the parallelogram array or the circular array is used.

In a specific implementable solution, the material layer is an organic material layer. The organic material layer may be made of a metal oxide or a nitride, for example, $TiO_2$, $Ta_2O_5$, $HfO_2$, or $Si_3N_4$.

An embodiment of this application further provides a display apparatus. The display apparatus includes a substrate and a display module that is disposed on the substrate. The display module is the OLED display module according to any one of the foregoing implementations. In the foregoing technical solution, a polarization state of a light ray emitted from a display layer is changed through cooperation between a light enhancement layer and a metal wire in the display module, so that more light rays can pass through a circular polarizer, to improve brightness of the display module. In addition, a disposed light absorption layer absorbs reflected light of an external light ray at a circuit layer, to suppress reflection of the external light ray and improve display effect of the display module.

It is clear that a person skilled in the art can make various modifications and variations to this application without departing from the spirit and scope of this application. This application is intended to cover these modifications and variations of this application provided that they fall within the scope of protection defined by the following claims and their equivalent technologies.

What is claimed is:

1. An OLED display comprising:
   a stack comprising:
      a display layer,
      a light absorption layer,
      a light enhancement layer, and a circular polarizer, wherein the light enhancement layer and the light absorption layer are stacked between the display layer and the circular polarizer, and the light absorption layer is closer to the display layer than the light enhancement layer;

the display layer comprising a pixel area and a non-pixel area, and an arrangement direction of the pixel area and the non-pixel area is perpendicular to a stacking direction of the display layer and the circular polarizer, the pixel area comprising at least a blue pixel area, a red pixel area and a green pixel area;

the light enhancement layer being further configured to act on a blue light band and being disposed above the blue pixel area;

the light absorption layer is configured to transmit a light ray emitted from the pixel area of the display layer, and absorb a light ray emitted from the non-pixel area of the display layer, the light absorption layer comprising a light transmission area corresponding to the blue pixel area, and at least one of (a) a yellow area configured to absorb a blue light ray and that corresponds to another pixel area, or (b) a black area corresponding to the non-pixel area and a yellow area corresponding to another pixel area;

the light ray that passes through the light absorption layer comprises a first light ray in a first polarization state and a second light ray in a second polarization state; and the light enhancement layer is configured to transmit the first light ray in the first polarization state, and is further configured to reflect at least a part of the second light ray in the second polarization state to a metal wire in the OLED display, to form a second light ray in a first polarization state through reflection by the metal wire; and the circular polarizer is configured to transmit the first light ray in the first polarization state or a second light ray in a first polarization state that passes through the light enhancement layer.

2. The OLED display according to claim 1, wherein a light band enhanced by the light enhancement layer comprises a blue light band, a green light band, a red light band, or another band of visible light; and a light band absorbed by the light absorption layer is the same light band as the light band enhanced by the light enhancement layer.

3. The OLED display according to claim 1, wherein the light absorption layer comprises the black area corresponding to the non-pixel area and the light transmission area corresponding to the pixel area.

4. The OLED display according to claim 1, wherein the light enhancement layer acts on a blue light band.

5. The OLED display according to claim 1, wherein the light enhancement layer is a cholesteric liquid crystal layer or a material layer with a microstructure, and the microstructure is a nanostructure capable of implementing circularly polarized light selection.

6. The OLED display according to claim 5, wherein when the light enhancement layer is the material layer with a microstructure comprising a parallelogram array or a circular array.

7. The OLED display of claim 1 wherein placement of the light transmission area above the blue pixel prevents a light ray emitted from the blue pixel area from being absorbed by the light absorption layer.

8. The OLED display of claim 1 wherein the yellow area that can absorb the blue light ray is disposed in another area, to ensure that the blue light ray can be absorbed by using the another area, thereby reducing reflection effect of the display apparatus on an external light ray.

9. An OLED display, comprising:

a display layer and a circular polarizer that are stacked, and a light enhancement layer disposed between the display layer and the circular polarizer, wherein the display layer has a pixel area and a non-pixel area, and an arrangement direction of the pixel area and the non-pixel area is perpendicular to a stacking direction of the display layer and the circular polarizer, the pixel area comprising at least a blue pixel area, a red pixel area and a green pixel area;

a light ray emitted from the display layer comprises a first light ray in a first polarization state and a second light ray in a second polarization state;

the light enhancement layer comprises a light enhancement area corresponding to the pixel area, and the light enhancement area is configured to transmit the first light ray in the first polarization state, and is configured to reflect at least a part of the second light ray in the second polarization state to a metal wire in the OLED display, the metal wire reflecting the second light ray to form a second light ray in a first polarization state, the light enhancement layer disposed above the blue pixel area;

a light absorption layer comprising a light transmission area corresponding to the blue pixel area, and at least one of (a) a yellow area configured to absorb a blue light ray and that corresponds to another pixel area, or (b) a black area corresponding to the non-pixel area and a yellow area corresponding to another pixel area; and the circular polarizer is configured to transmit the first light ray in the first polarization state or the second light ray in a first polarization state that passes through the light enhancement layer.

10. The OLED display according to claim 9, wherein the light enhancement layer is a cholesteric liquid crystal layer or a material layer with a microstructure capable of implementing circularly polarized light selection.

11. The OLED display according to claim 10, wherein when the light enhancement layer is the material layer with a microstructure comprising a parallelogram array or a circular array.

12. The OLED display according to claim 9, wherein the light absorption layer comprises a black area corresponding to the non-pixel area, and the light enhancement area is located in the light transmission area.

13. A display apparatus, comprising:

a substrate and an OLED display that is disposed on the substrate, the OLED display comprising a stack including:

a display layer, a light absorption layer, a light enhancement layer, and a circular polarizer, wherein the light enhancement layer and the light absorption layer are stacked between the display layer and the circular polarizer, and the light absorption layer is stacked closer to the display layer than the light enhancement layer;

the display layer has a pixel area and a non-pixel area, an arrangement direction of the pixel area and the non-pixel area is perpendicular to a stacking direction of the display layer and the circular polarizer, the pixel area comprising at least a blue pixel area, a red pixel area and a green pixel area, the light enhancement layer disposed above the blue pixel area;

the light absorption layer is configured to transmit a light ray emitted from the pixel area of the display layer, and absorb a light ray emitted from the non-pixel area of the display layer, the light absorption layer comprising a light transmission area corresponding to the blue pixel area, and at least one of (a) a yellow area configured to absorb a blue light ray and that corresponds to another pixel area, or (b) a black area corresponding to the non-pixel area and a yellow area corresponding to another pixel area;

the light ray that passes through the light absorption layer comprises a first light ray in a first polarization state and a second light ray in a second polarization state; and the light enhancement layer is configured to transmit the first light ray in the first polarization state, and is configured to reflect at least a part of the second light ray in the second polarization state toward a metal wire in the OLED display, to form a second light ray in a first polarization state through reflection by the metal wire; and the circular polarizer is configured to transmit the first light ray in the first polarization state or the second light ray in a first polarization state that passes through the light enhancement layer.

14. The display apparatus according to claim 13, wherein a light band enhanced by the light enhancement layer comprises a blue light band, a green light band, a red light band, or another band of visible light; and a light band absorbed by the light absorption layer is the same light band as the light band enhanced by the light enhancement layer.

15. The display apparatus according to claim 13, wherein the light absorption layer comprises the black area corresponding to the non-pixel area and a light transmission area corresponding to the pixel area.

16. The display apparatus according to claim 13, wherein the light enhancement layer acts on a blue light band.

17. The display apparatus according to claim 13, wherein the light enhancement layer is a cholesteric liquid crystal layer or a material layer with a microstructure, and the microstructure is a nanostructure capable of implementing circularly polarized light selection.

18. The display apparatus according to claim 17, wherein when the light enhancement layer is the material layer with a microstructure comprising a parallelogram array or a circular array.

19. The display apparatus of claim 13 wherein placement of the light transmission area above the blue pixel prevents a light ray emitted from the blue pixel area from being absorbed by the light absorption layer.

20. The display apparatus of claim 13 wherein the yellow area that can absorb the blue light ray is disposed in another area, to ensure that the blue light ray can be absorbed by using the another area, thereby reducing reflection effect of the display apparatus on an external light ray.

* * * * *